US008959938B2

(12) United States Patent
Ito et al.

(10) Patent No.: US 8,959,938 B2
(45) Date of Patent: Feb. 24, 2015

(54) COOLING SYSTEM AND METHOD FOR CONTROLLING COOLING SYSTEM

(71) Applicant: Hitachi Plant Technologies, Ltd., Toshima-ku, Tokyo (JP)

(72) Inventors: Junichi Ito, Nagareyama (JP); Yasuhiro Kashirajima, Tokyo (JP); Yasuhiko Inadomi, Saitama (JP); Tomohiro Yoshida, Tokyo (JP)

(73) Assignee: Hitachi Ltd., Tokyo (JP)

( * ) Notice: Subject to any disclaimer, the term of this patent is extended or adjusted under 35 U.S.C. 154(b) by 216 days.

(21) Appl. No.: 13/654,460

(22) Filed: Oct. 18, 2012

(65) Prior Publication Data

US 2013/0091881 A1    Apr. 18, 2013

(30) Foreign Application Priority Data

Oct. 18, 2011    (JP) .................................. 2011-229159

(51) Int. Cl.
*F25D 15/00*    (2006.01)
*H05K 7/20*    (2006.01)

(52) U.S. Cl.
CPC ........ *H05K 7/20827* (2013.01); *H05K 7/20836* (2013.01)
USPC .............................................. 62/119; 62/335

(58) Field of Classification Search
CPC ...................... H05K 7/20836; H05K 7/20827
USPC ............................ 62/119, 190, 118, 333, 335
See application file for complete search history.

(56) References Cited

U.S. PATENT DOCUMENTS

| 4,104,890 | A | * | 8/1978 | Iwasaki | ........................ | 62/324.1 |
| 4,285,211 | A | * | 8/1981 | Clark | .............................. | 62/335 |
| 4,291,757 | A | * | 9/1981 | Redden | .................... | 165/104.31 |
| 4,344,828 | A | * | 8/1982 | Melton | ........................... | 203/19 |
| 5,894,739 | A | * | 4/1999 | Temos | ........................... | 62/436 |

(Continued)

FOREIGN PATENT DOCUMENTS

CN    1890515 A    1/2007
WO    WO 2005/057097    6/2005

OTHER PUBLICATIONS

CN Office Action of Appln. No. 201210390543 dated May 5, 2014.
(Continued)

*Primary Examiner* — Mohammad M Ali
(74) *Attorney, Agent, or Firm* — Antonelli, Terry, Stout & Kraus, LLP.

(57) ABSTRACT

A cooling system includes an evaporator for evaporating a refrigerant to cool an object to be cooled; a refrigerant-supply-flow-rate regulator for regulating a flow rate of the refrigerant to be supplied to the evaporator; a condenser for condensing the refrigerant by cooling the refrigerant by use of a chilled fluid; and a chilled-fluid-flow-rate regulator for regulating a flow rate of the chilled fluid to be supplied to the condenser, the refrigerant condensed by the condenser being to be pressurized to be supplied to the evaporator. The chilled-fluid-flow-rate regulator regulates a flow rate of the fluid, to be supplied to the evaporator, for a temperature of the refrigerant condensed to come to a predetermined target refrigerant-liquid temperature, and the refrigerant-supply-flow-rate regulator regulates a flow rate of the refrigerant, to be supplied to the evaporator, for a temperature of the object cooled to come to a predetermined target cooling temperature.

6 Claims, 3 Drawing Sheets

(56) References Cited

U.S. PATENT DOCUMENTS

| | | | | |
|---|---|---|---|---|
| 6,233,968 B1 * | 5/2001 | Nishiguchi et al. | ............. | 62/476 |
| 6,237,356 B1 * | 5/2001 | Hori et al. | .................... | 62/324.1 |
| 6,293,119 B1 * | 9/2001 | Wenzel | ........................ | 62/238.6 |
| 6,460,355 B1 * | 10/2002 | Trieskey | ......................... | 62/175 |
| 6,474,099 B2 * | 11/2002 | Tanaka et al. | ................... | 62/480 |
| 6,606,872 B1 * | 8/2003 | Smith | ............................. | 62/175 |
| 6,915,649 B2 * | 7/2005 | Amaral et al. | ................... | 62/244 |
| 7,251,944 B2 * | 8/2007 | Holtzapple et al. | ................ | 62/93 |
| 7,310,953 B2 * | 12/2007 | Pham et al. | ...................... | 62/3.2 |
| 7,340,912 B1 * | 3/2008 | Yoho et al. | ...................... | 62/305 |
| 7,631,515 B2 * | 12/2009 | Jacobi | ............................. | 62/434 |
| 7,658,079 B2 * | 2/2010 | Bailey et al. | .................... | 62/181 |
| 7,827,807 B2 * | 11/2010 | Narayanamurthy et al. | ..... | 62/59 |
| 7,905,096 B1 | 3/2011 | Campbell | | |
| 7,990,710 B2 * | 8/2011 | Hellriegel et al. | ............ | 361/699 |
| 8,136,368 B2 * | 3/2012 | Reich et al. | ...................... | 62/434 |
| 8,151,582 B2 * | 4/2012 | Simadiris et al. | ............... | 62/185 |
| 8,171,743 B2 * | 5/2012 | Shin | ................................. | 62/56 |
| 8,234,876 B2 * | 8/2012 | Parsonnet et al. | ................. | 62/59 |
| 8,635,870 B2 * | 1/2014 | Kasuya et al. | .................. | 60/618 |
| 2010/0165565 A1 * | 7/2010 | Hellriegal et al. | ....... | 361/679.46 |
| 2010/0236772 A1 | 9/2010 | Novotny et al. | | |

OTHER PUBLICATIONS

Singaporean Search Report of Appln. No. 2012077723 dated May 6, 2014 in English.

* cited by examiner

COOLING SYSTEM AND METHOD FOR CONTROLLING COOLING SYSTEM

CROSS-REFERENCE TO RELATED APPLICATIONS

This application is based upon and claims the benefit of priority from Japanese Patent Application P2011-229159 (filed on Oct. 18, 2011); the entire contents of which are incorporated herein by reference.

BACKGROUND OF THE INVENTION

1. Field of the Invention

The present invention relates to a cooling system and a method for controlling the cooling system which cool an object to be cooled by circulating a refrigerant.

2. Description of Related Art

Conventionally, there is adopted a cooling system which is directed to improvement on heat conveyance efficiency by latent heat transfer and cooling an object to be cooled without circulating chilled water. In the cooling system, a condenser at the first side performs heat-exchange between a chilled water and a refrigerant to condense the refrigerant, and the condensed refrigerant is supplied to the evaporator at the second side to perform heat-exchange with the object to be cooled (air etc.).

Such a cooling system cools the object to be cooled by use of evaporation heat of the refrigerant to be gasified (evaporated) by the evaporator. Therefore, the cooling system requires regulating the flow-rate of the refrigerant to flow in the evaporator and keeping an evaporation pressure in the evaporator under a predetermined value.

As such a technique of the cooling system, for example, the technique described in the Patent Document 1 (Patent National Publication of translated version NO. 2007-5141212) is disclosed. The technique disclosed in the Patent Document 1 includes, in a vicinity of the evaporator, a flow-rate regulating valve for regulating a flow rate of the refrigerant. This technique regulates the flow rate of the refrigerant in response to variation of the load, appropriately keeping the flow rate of the refrigerant to flow into the evaporator.

However, in the technique disclosed in the Patent Document 1, when the circulation flow rate of the refrigerant is decreased during partial load operation, the refrigerant pressure in the system is lowered to lower the evaporation temperature of the refrigerant in the evaporator, occasionally excessively cooling an object for being cooled (air).

The invention is directed to a cooling system and a method for controlling the cooling system, which appropriately cool an object to be cooled even under a partial load operation.

SUMMARY OF THE INVENTION

An aspect of the invention provides a cooling system and a method for controlling the cooling system including: one or more evaporators, each of the evaporators for evaporating a refrigerant and cooling an object to be cooled by heat exchange between the refrigerant and the object to be cooled; a refrigerant-supply-flow-rate regulator for regulating a flow rate of the refrigerant to be supplied to each of the evaporators; a post-cooling temperature measurement device for measuring a temperature of the object that is cooled by each of the evaporators through heat exchange with the refrigerant; a condenser for condensing the refrigerant, evaporated by the evaporator, by cooling the refrigerant through heat exchange between the refrigerant and a chilled water; and a refrigerant-temperature measurement device for measuring a temperature of the refrigerant condensed by the condenser; and a chilled-water-flow-rate regulator for regulating a flow rate of the chilled water to be supplied to the condenser. The refrigerant condensed by the condenser is pressurized to be supplied to all of the evaporators. The chilled-water-flow-rate regulator regulates a flow rate of the chilled water, to be supplied to the condenser, for a temperature of the condensed refrigerant to come to a predetermined target refrigerant-liquid temperature. The refrigerant-supply-flow-rate regulator regulates the flow rate of the refrigerant, to be supplied to each of the evaporators, for a temperature of the object cooled to come to a predetermined target cooling temperature for each of the evaporators.

According to the invention, the cooling system and the method for controlling the cooling system are provided, which appropriately cool the object to be cooled even under a partial load operation. The cooling system and the method for controlling the cooling system are provided, which prevent excessive cooling during the partial load operation and enhance energy saving in response to a load.

BRIEF DESCRIPTION OF THE ACCOMPANYING DRAWINGS

DETAILED DESCRIPTION OF THE PREFERRED EMBODIMENTS

An embodiment of the present invention will hereby be described with reference to the drawings.

Figure 1:
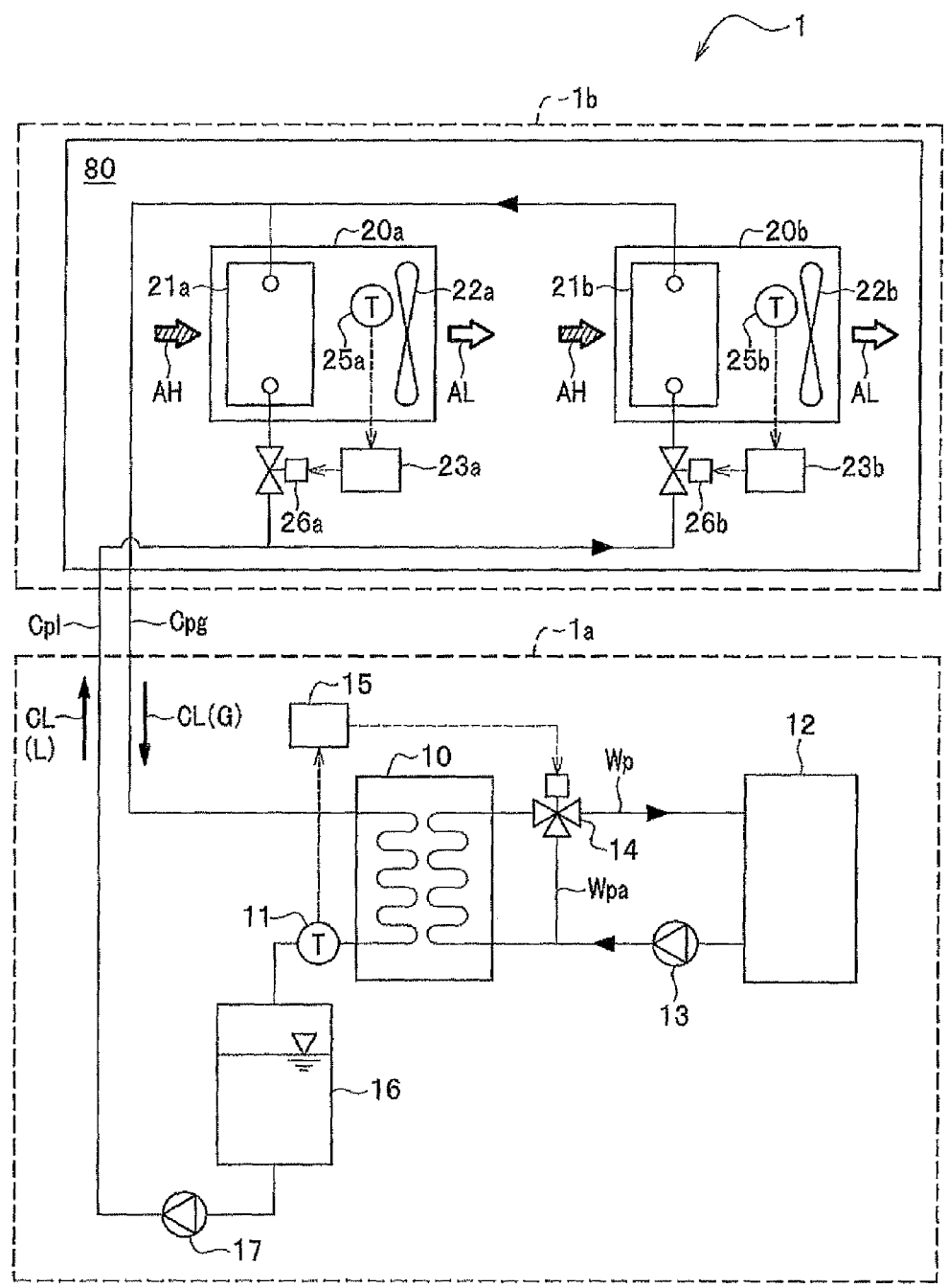
FIG. 1 is a diagram illustrating a configuration example of a cooling system according to the present embodiment.

A cooling system 1 according to the embodiment, as illustrated in FIG. 1, is configured in such a manner that a refrigerant CL circulates to cool an object to be cooled to a predetermined temperature (target cooling temperature). The cooling system 1 includes a first side 1a where the refrigerant CL is cooled to be condensed, and a second side 1b where the refrigerant CL takes heat from the object to be cooled for evaporating.

Hereafter, an evaporated gaseous refrigerant CL is referred to as a refrigerant gas CL (G), and a liquefied liquid refrigerant CL is referred to as a refrigerant-liquid CL (L), if necessary.

The second-side 1b corresponds to a system which cools a cooler object with the refrigerant CL (L) out of which heat is taken during evaporating. In this embodiment, the object to be cooled is a high-temperature exhaust AH which is discharged from the servers (not shown in Figs.) arranged in a data center 80.

The data center 80 includes coolers (FIG. 1 illustrates two coolers 20a, 20b) for cooling the high-temperature exhausts AH discharged from the servers.

Hereafter, the configuration including two coolers 20a, 20b are explained as an example. If the configuration includes three or more coolers, each of the coolers has an identical construction and function.

It should be noted that the cooling system 1 provided in the data center 80 is just one example, and the cooling system 1 according to the embodiment is capable of being appropriately installed at the place where an object to be cooled such as air is cooled.

The refrigerant CL (L), which is condensed by the condenser 10 provided on the first side 1a, is pumped by the refrigerant pump 17 to circulate through the refrigerant-liquid pipe Cpl, and is supplied to the evaporator 21a provided to the cooler 20a and the evaporator 21b provided to the cooler 20b. The evaporator 21a, 21b has thin pipes arranged therein, through which the supplied refrigerant-liquid CL (L) flows. The evaporators 21a, 21b are configured in such a manner that the high-temperature exhausts AH from the data center 80 flow around on the thin pipes to be made to exchange heat with the refrigerant-liquids CL (L). In the evaporators 21a, 21b, the refrigerant-liquid (L) is evaporated to the refrigerant-liquid (G) by taking evaporation heat from the high-temperature exhaust AH, which is cooled to be turned into low-temperature air AL.

It should be noted that the coolers 20a, 20b may include blowers 22a, 22b for the high-temperature exhausts AH to efficiently circulate through the evaporators 21a, 21b.

The coolers 20a, 20b include evaporator-outlet-air temperature sensors 25a, 25b (post-cooling temperature measurement devices) for measuring temperatures of low-temperature airs AL to which high-temperature exhausts AH is cooled by the evaporators 21a, 21b. The coolers 20a, 20b include refrigerant-flow-rate control valves 26a, 26b for regulating the flow rate of the refrigerant-liquid CL (L) to be supplied to the evaporators 21a, 21b. The coolers 20a, 20b include refrigerant-flow-rate controllers 23a, 23b for controlling the refrigerant-flow-rate control valves 26a, 26b. In this embodiment, the refrigerant-flow-rate control valves 26a, 26b and refrigerant-flow-rate controllers 23a, 23b constitute a refrigerant-supply-flow-rate regulator.

As described above, the second side 1b of the cooling system 1 is configured.

The first side 1a is configured in such a manner that a chilled water, which is cooled by a cold heat source 12, and a refrigerant gas CL (G), which is evaporated on the second side 1b, are made to exchange heat with each other by the condenser 10 for condensing the refrigerant gas CL (G).

The chilled water, which is cooled by the cold heat source 12, is pumped out by the chilled-water pump 13 through the chilled-water pipe Wp which is disposed to pass through the condenser 10. The chilled water is made, in the condenser 10, to exchange heat with the refrigerant gas CL (G) of a relatively high temperature which is sent through the refrigerant gas pipe Cpg from the second side 1b, and is raised in temperature before returning to the cold heat source 12 to be cooled.

It should be noted that the chilled-water pipe Wp includes a bypass pipe Wpa which is disposed in parallel with the pipe in the condenser 10. The three-way valve 14 regulates a flow-rate of a chilled water circulating in the condenser 10 and a chilled water circulating through the bypass pipe Wpa.

The three-way valve 14 may be configured as a flow-rate regulating valve which is capable of regulating a flow-rate ratio of a circulating flow-rate of a chilled water circulating through the bypass pipe Wpa and a circulating flow rate of a chilled water circulating through the pipe in the condenser 10, and which is controlled by the refrigerant temperature controller 15.

The three-way valve 14 regulates a circulating flow-rate of the chilled water circulating through the bypass pipe Wpa and a circulating flow-rate of a chilled water circulating through the pipes in the condenser 10 to regulate a flow rate of the chilled water that is supplied to the condenser 10. In the embodiment, the three-way valve 14 and refrigerant temperature controller 15 constitute a chilled-water-flow-rate regulator.

The cold heat source 12 is not limited, and may be a refrigerator and the like capable of cooling a chilled water.

The refrigerant gas CL (G), after being evaporated at the second side 1b, is sent through the refrigerant gas pipe Cpg to the first side 1a. The refrigerant gas CL (G) is made to exchange heat with the chilled water in the condenser 10 to be cooled and condensed into a liquid refrigerant-liquid CL (L). The refrigerant-liquid CL (L), which is condensed by the condenser 10, is reserved in a refrigerant-liquid tank 16, and, thereafter, is pressurized by a refrigerant pump 17 and is sent to the second side 1b through the refrigerant-liquid pipe Cpl. The refrigerant pump 17 may be constructed to be capable of easily changing a rotation frequency (rotation speed), and, for example, may be constructed to be inverter controlled. This construction facilitates regulating a flow rate of the refrigerant-liquid CL (L) which circulates through the refrigerant-liquid pipe Cpl.

It should be noted that the temperature of the refrigerant-liquid CL (L), which is condensed by the condenser 10, is measured by a refrigerant-temperature measurement device (condenser-refrigerant-liquid temperature sensor 11). The measured value is input into the refrigerant temperature controller 15.

The refrigerant temperature controller 15 regulates a flow rate of the chilled water supplied to the condenser 10 for the measured value (temperature of the refrigerant-liquid CL (L)) by the condenser-refrigerant-liquid temperature sensor 11 to come to a predetermined target temperature (target refrigerant-liquid temperature).

To be specific, the refrigerant temperature controller 15 adjusts the three way valve 14 to decrease the flow rate of the chilled water to be supplied to the condenser 10, if the measured value (temperature of the refrigerant-liquid CL (L)) by the condenser-refrigerant-liquid temperature sensor 11 is lower than the target refrigerant-liquid temperature. The refrigerant temperature controller 15 adjusts the three way valve 14 to increase the flow rate of the chilled water to be supplied to the condenser 10, if the measured value (temperature of the refrigerant-liquid CL (L)) by the condenser-refrigerant-liquid temperature sensor 11 is higher than the target refrigerant-liquid temperature. Thus, the refrigerant temperature controller 15 regulates the flow rate of the chilled water to be supplied to the condenser 10.

The cooling system 1 of the embodiment including such a configured first side 1a and second side 1b is configured to obtain low-temperature air AL of a predetermined target temperature (target cooling temperature) from high-temperature exhaust AH of a predetermined temperature (high-temperature-side temperature) through a rated operation. For instance, when the cooling pump 13 and the refrigerant pump 17 are operated under the rated operation, the cooling system 1 is configured to lower the high-temperature exhausts AH from high-temperature-side temperatures of 40° C. to the target cooling temperatures of 25° C. to obtain low-temperature airs AL.

It should be noted that in this case, the evaporation temperature of the refrigerant-liquid CL (L) may be a temperature (for example, 23° C.) lower than the temperature of 25° C. that is target cooling temperatures of the low-temperature airs AL.

The refrigerant-liquid CL (L), which is condensed by the condenser 10, may be kept at a target refrigerant-liquid temperature which is appropriately set to generate a pressure for the above-described evaporation temperature.

The high-temperature exhaust AH in the data center 80 is exhaust from the above-described servers (not illustrated). The temperature of the high-temperature exhaust AH varies due to the circumferential temperature and operation states of the servers. In the cooling system 1 which is operated under the rated operation to lower the high-temperature exhaust AH from 40° C. to 25° C., when the temperature of the high-temperature exhaust AH varies, the temperature of the low-temperature air AL does not occasionally come to the target cooling temperature (for example, 25° C.).

For instance, if the temperatures of the high-temperature exhausts AH become lower than a predetermined high-temperature-side temperature when the temperatures of the refrigerant-liquids in the evaporators 21b, 21b do not vary, the high-temperature exhausts AH are excessively cooled, and the temperatures of the low-temperature airs AL become lower than the target cooling temperatures.

Herein, the refrigerant-flow-rate controllers 23a, 23b at the second side 1b adjust respectively the refrigerant-flow-rate control valves 26a, 26b to make the temperatures of the low-temperature airs AL, which are measured by the evaporator-outlet-air temperature sensors 25a, 25b, come to the target cooling temperatures, regulating flow-in rates of the refrigerant-liquids CL (L) to be supplied to the evaporators 21a, 21b.

The evaporators 21a, 21b cool the high-temperature exhausts AH out of which evaporation heats are taken during evaporating of the refrigerant-liquids CL (L), obtaining the low-temperature airs AL. Therefore, for example, if the temperatures of the low-temperature airs AL are higher than the target cooling temperatures, each evaporation heat of the refrigerant-liquids CL (L) in the evaporators 21a, 21b may increase (namely, each amount of evaporations increases).

In the evaporators 21a and 21b, as the pressures of the refrigerant-liquids CL (L) lower, the evaporation temperatures are lowered and amounts of evaporations are increased. The pressures of the refrigerant-liquids CL (L) in the evaporators 21a and 21b are pressures during sending of the refrigerant-liquid CL (L) to the second side 1b (for example, discharge pressure of the refrigerant pump 17). On the other hand, decreasing flow-in rates of the refrigerant-liquids CL (L) by the refrigerant-flow-rate control valves 26a, 26b permits the pressures of the refrigerant-liquids CL (L) in evaporators 21a, 21b to be lowered.

If the evaporator-outlet-air temperature sensors 25a, 25b have measurement values higher than the target cooling temperatures (for example, 25° C.), the refrigerant-flow-rate controllers 23a, 23b adjust the refrigerant-flow-rate control valves 26a, 26b. This adjustment decreases flow-in rates of the refrigerant-liquids CL (L) to be supplied to the evaporators 21a, 21b, and lowers the pressures of the refrigerant-liquids CL (L) in the evaporators 21a, 21b.

On the other hand, if the evaporator-outlet-air temperature sensors 25a, 25b have measurement values lower than the target cooling temperatures, the refrigerant-flow-rate controllers 23a, 23b adjust the refrigerant-flow-rate control valves 26a, 26b. This control increases flow-in rates of the refrigerant-liquids CL (L) to be supplied to the evaporators 21a, 21b, and raises the pressures of the refrigerant-liquids CL (L) in the evaporators 21a, 21b.

For example, the configuration may be the following. The temperature differences between the respective measurement values of the evaporator-outlet-air temperature sensor 25a, 25b and the corresponding target cooling temperatures are fed back to the corresponding refrigerant-flow-rate controllers 23a, 23b. The refrigerant-flow-rate controllers 23a, 23b adjust respectively the opening degrees of the refrigerant-flow-rate control valves 26a, 26b to make the fed-back temperature differences come to "0". For example, if the measurement values of the evaporator-outlet-air temperature sensor 25a, 25b are higher than the target cooling temperatures, the refrigerant-flow-rate controllers 23a, 23b adjust respectively the refrigerant-flow-rate control valves 26a, 26b to decrease the flow rates of the refrigerant-liquids CL (L) to be supplied to the evaporators 21a, 21b (decreasing of the pressures of the refrigerant-liquids CL (L)). On the other hand, if the measurement values of the evaporator-outlet-air temperature sensor 25a, 25b are lower than the target cooling temperature, the refrigerant-flow-rate controllers 23a, 23b adjust respectively the refrigerant-flow-rate control valves 26a, 26b to increase the flow rates of the refrigerant-liquids CL (L) to be supplied to the evaporators 21a, 21b (increasing of the pressures of the refrigerant-liquids CL (L)).

The configuration may be also the following. The appropriate adjustment amounts of the opening degrees of refrigerant-flow-rate control valves 26a, 26b, corresponding to the temperature differences between respective measurement values of the evaporator-outlet-air temperature sensor 25a, 25b and the corresponding target cooling temperatures, are previously found by experimental measurements and the like. The result is stored as data of a map format in a memory section not shown in Figs. In this configuration, the refrigerant-flow-rate controllers 23a, 23b set respectively the opening degrees of the refrigerant-flow-rate control valves 26a, 26b based on the temperature differences between the respective measurement values of the evaporator-outlet-air temperature sensors 25a, 25b and the corresponding target cooling temperatures, referring to this data of the map format. It may be configured in such a manner that the refrigerant-flow-rate controllers 23a, 23b adjust respectively the refrigerant-flow-rate control valves 26a, 26b based on the set opening-degree adjustment amounts.

As described above, the cooling system 1 according to this embodiment regulates the flow-rate of a chilled water to be supplied to the condenser 10 to make the refrigerant-liquid CL (L) come to a predetermined target refrigerant-liquid temperature to be condensed at the first side 1a. To make each temperature of the low-temperature airs AL come to a predetermined target cooling temperature for each of the evaporators 21a, 21b, the cooling system 1 regulates the pressures of the refrigerant-liquids CL (L) in the evaporators 21a, 21b at the second side 1b. To be specific, the refrigerant-flow-rate controllers 23a, 23b adjust respectively the refrigerant-flow-rate control valves 26a, 26b to make the respective temperatures of low-temperature airs AL come to the corresponding target cooling temperatures for the evaporators 21a, 21b, to regulate the flow rates of the refrigerant-liquids CL (L) to be supplied to the evaporators 21a, 21b.

According to this configuration, even if the temperature of the high-temperature exhaust AH lowers below a predetermined high-temperature-side temperature to reduce the cooling load at the second side 1b with the cooling system 1 operated under a partial load operation, the temperatures of the low-temperature airs AL cooled by the evaporators 21a, 21b are kept at predetermined target cooling temperatures with the refrigerant pump 17 operated under a rated operation. The configuration prevents the pressures of the refrigerant-liquids CL (L) from being decreased by reducing the flow-in rates of the refrigerant-liquids CL (L) to be supplied to the evaporators 21a, 21b, which prevents the high-temperature exhausts AH from being excessively cooled. Only opening degree adjustments of the refrigerant-flow-rate control valves 26a, 26b, based on only the temperature variations of the low-temperature airs AL measured by the evaporator-outlet-air temperature sensor 25a, 25b, keep the temperatures of the low-temperature airs AL at predetermined target cooling temperatures. This adjustment simplifies the control logic, and simplifies the system construction of the cooling system 1.

It should be noted that the cooling system 1 as illustrated in FIG. 1 is configured in such a manner that the refrigerant CL (L) condensed by the condenser 10 is pressurized by the pump 17 to be sent to the second side 1b. On the other hand, this embodiment is applicable to the cooling system of refrigerant natural-circulation type (free cooling). This cooling system is configured in such a manner that the height difference between the first side 1a and the second side 1b and the density difference between the liquid refrigerant-liquid CL (L) and the gaseous refrigerant gas CL (G) allow the refrigerant CL to naturally circulate.

In the refrigerant natural-circulation type, it is required that the first side 1a is disposed to be higher than the second side 1b. This disposition allows the refrigerant gas CL (G) of a smaller density to flow upward in the refrigerant gas pipe Cpg to be sent to the first side 1a, and allows the refrigerant-liquid CL (L) of a larger density to flow downward (naturally drop) in the refrigerant-liquid pipe Cpl to be sent to the second side 1b. This configuration allows the refrigerant-liquid CL (L) condensed by the condenser 10 to naturally drop in the refrigerant-liquid pipe Cpl due to the height difference between the first side 1a and the second side 1b, and to be pressurized to be sent to the second side 1b. Thereafter, it may be configured in such a manner that the refrigerant-flow-rate control valve 26a, 26b regulate the flow rates of the refrigerant-liquids CL (L) to be supplied to the evaporators 21a, 21b, namely, the pressures of the refrigerant-liquids in the evaporators 21a, 21b. Such a configuration allows this embodiment to be applied to the cooling system of the refrigerant natural-circulation type.

Figure 2:
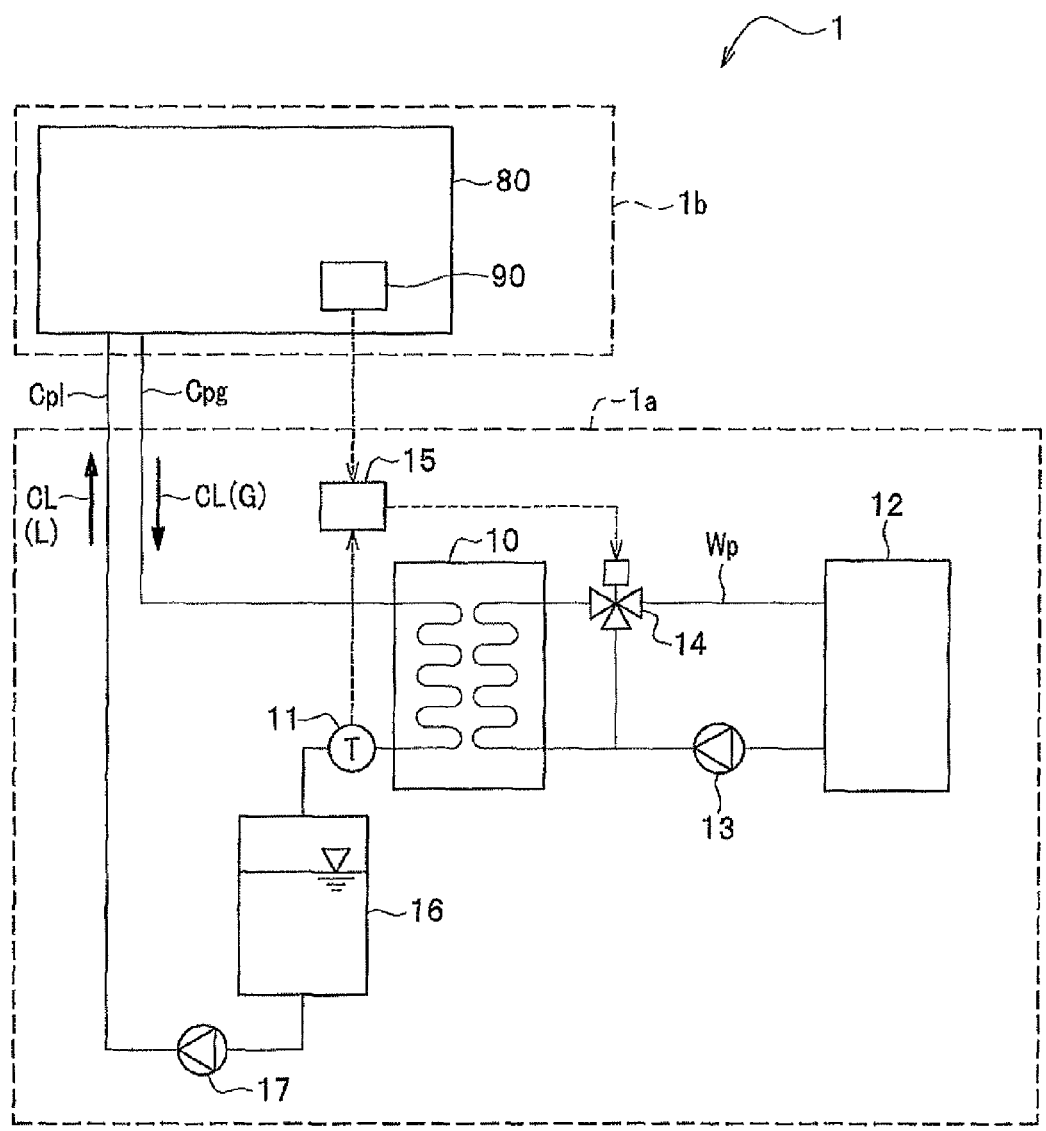
FIG. 2 is a diagram illustrating a configuration of a data center with a dew-point thermometer.

As illustrated in FIG. 2, it may be configured that the data center 80 includes a dew-point temperature measurement device (dew-point thermometer 90), which measures the dew-point temperature in the data center 80, namely, the dew-point temperature of the peripheral environment around the evaporators 21a, 21b placed therein, and the measured value is input to the refrigerant temperature controller 15. If the target refrigerant-liquid temperature is lower than the dew-point temperature in the data center 80, the refrigerant temperature controller 15 adjusts three-way valve 14 to render the temperature of the refrigerant-liquid CL (L), measured by the condenser-refrigerant-liquid temperature sensor 11, higher than the dew-point temperature of the data center 80. This adjustment allows the temperature of the refrigerant-liquid CL (L), to be sent to the second side 1b, to become higher than the dew-point temperature of the air in the data center 80. Therefore, the cooling system 1 prevents dew condensation on the coolers 20a, 20b, which prevents malfunction of the servers (not shown in Figs.), housed in the data center 80, by a water droplet produced by the dew condensation.

To be specific, if the refrigerant CL (L) condensed by the condenser 10 is kept at the target refrigerant-liquid temperature when the dew-point temperature is lower than the target refrigerant-liquid temperature, the refrigerant temperature controller 15 adjusts the three-way valve 14 to lower the flow-rate ratio of the chilled water to be supplied to the condenser 10, and to raise the temperature of the refrigerant-liquid CL (L) to be condensed in the condenser 10. Such a configuration allows the temperature of the refrigerant-liquid CL (L), which is to be supplied to the evaporators 21a, 21b (see FIG. 1), to be higher than the dew-point temperature of the data center 80, preventing the dew condensation on the evaporators 21a, 21b.

The rotation frequency (rotation speed) of the refrigerant pump 17 may be configured to be regulated in response to the pressure difference between the refrigerant-liquids CL (L) at the suction side and the discharge side of the refrigerant pump 17. For example, as shown in FIG. 3A, the configuration includes: a differential-pressure measurement device (differential pressure gauge 17a) for detecting the pressure difference ΔPp between the suction side 17i and the discharge side 17o of the refrigerant pump 17; and a refrigerant pump controller 17b for regulating the rotation speed of the refrigerant pump 17.

The refrigerant pump controller 17b regulates the rotation frequency of the refrigerant pump 17 for the measurement value (pressure difference ΔPp) of the differential pressure gage 17a to come to a predetermined differential-pressure setting value (for example, 0.1 MPa).

Figure 3A:
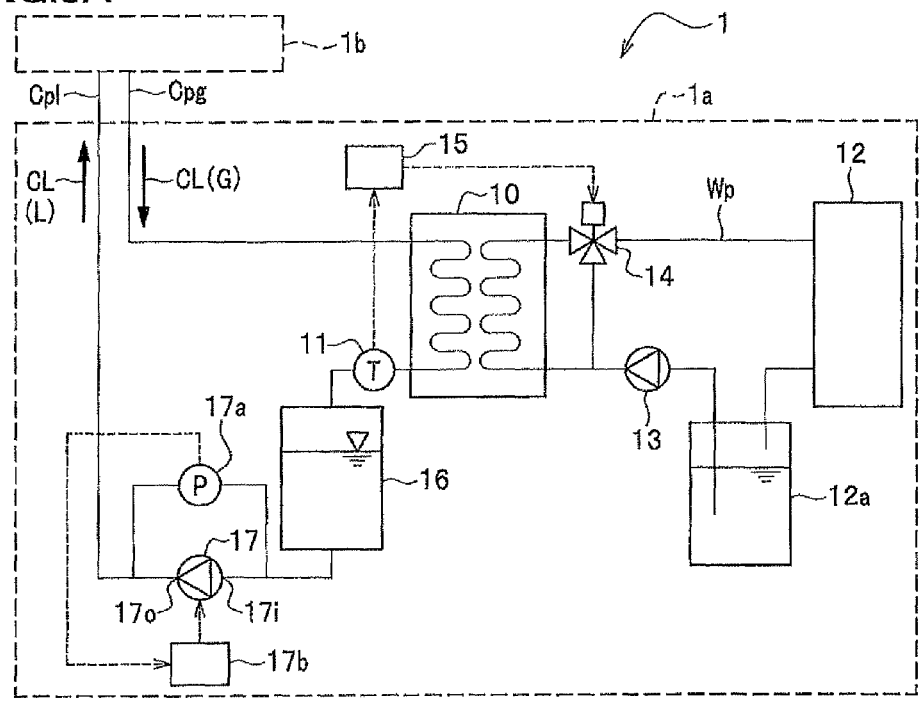
FIG. 3A is a diagram illustrating a configuration with a differential pressure gauge.

For example, as shown in FIG. 3A, if the cooling system 1 includes a buffer tank 12a for temporarily reserving the chilled water cooled by the cold heat source 12 even when the cold heat source 12 is failed to make it impossible to cool the chilled water, the refrigerant gas CL (G) evaporated at the second side 1b is cooled by the chilled water which is reserved in the buffer tank 12a. However, the chilled water which is not cooled by the cold heat source 12 rises in temperature, and the temperature rise of the chilled water causes the temperature of the refrigerant-liquid CL (L) condensed at the first side 1a to be raised. That is, if the temperature of the chilled water becomes higher, the regulation range of the flow rate by the three-way valve 14 fails to keep the temperature of the refrigerant-liquid CL (L) at the target refrigerant-liquid temperature, and the temperature of the refrigerant-liquid CL (L) occasionally becomes higher than the target refrigerant-liquid temperature. Thus, as the temperature of the refrigerant-liquid CL (L) rises, this rise causes the pressure within the refrigerant-liquid pipe Cpl to be raised.

In this case, if the pressure at the discharge side 17o of the refrigerant pump 17 is constant, the pushing force of the refrigerant pump 17 is weakened by the rise of the pressure within the refrigerant-liquid pipe Cpl. For example, if the second side 1b is disposed to be higher than the first side 1a, the refrigerant-liquid CL (L) condensed at the first side 1a fails to be stably sent to the second side 1b. This causes the high-temperature exhausts AH (see FIG. 1) to fail to be appropriately cooled at the second side 1b.

On the contrary, if the pressure difference ΔPp between the suction side 17i and the discharge side 17o of the refrigerant pump 17 is constant even when the pressure within the refrigerant pipe Cpl varies, the pushing force of the refrigerant pump 17 does not vary, enabling the refrigerant-liquid CL (L) to be stably sent to the second side 1b. Therefore, the high-temperature exhaust AH is appropriately cooled at the second side 1b.

Thus, the rotation frequency of the refrigerant pump 17 is controlled to make the pressure difference ΔPp between the suction side 17i and the discharge side 17o of the refrigerant pump 17 come to a predetermined differential-pressure setting value. This control appropriately cools the high-temperature exhausts AH (see FIG. 1) at the second side 1b, even if the temperature rise of the chilled water causes the temperature of the refrigerant-liquid CL (L) to be raised.

It should be noted that the differential-pressure setting value, which is kept as the pressure difference ΔPp between the suction side 17i and the discharge side 17o of the refrigerant pump 17, may be preset to the value which is proved by the experimental measurement and the like to enable the high temperature exhausts AH to be appropriately cooled in the evaporators 21a, 21b.

Thus, when the rotation frequency of the refrigerant pump 17 is controlled to make the pressure difference ΔPp between the suction side 17i and the discharge side 17o of the refrigerant pimp 17 come to a predetermined differential-pressure setting value, the configuration may include the UPS (uninterruptable power supply) for driving the server (not shown in Figs) in the data center 80 (see FIG. 1), even during the failure of commercial power supply, as a back-up power supply. This configuration appropriately cools the high-temperature exhausts AH (see FIG. 1) at the second side 1b, even when the commercial power supply, which serves as the power supply of the cooling system 1, is failed. For example, if the configuration includes the UPS as a power supply which is capable of driving the chilled water pump 13, the refrigerant pump 17, the refrigerant-temperature controller 15, the three-way valve 14, the refrigerant-flow-rate control valves 26a, 26b (see FIG. 1) and the refrigerant-flow-rate controllers 23a, 23b (see FIG. 1), the refrigerant gas CL (G) is condensed by the chilled water reserved in the buffer tank 12a, which allows the high-temperature exhausts AH to be cooled without driving the cold heat source 12 having a large amount of electricity power consumption.

In this case, though the cold heat source 12 is not driven for the temperature of the refrigerant liquid CL (L) to rise, the refrigerant pump 17 stably sends the refrigerant-liquid CL (L) to the second side 1b. Therefore, the second side 1b allows the high-temperature exhaust AH to be appropriately cooled.

Figure 3B:
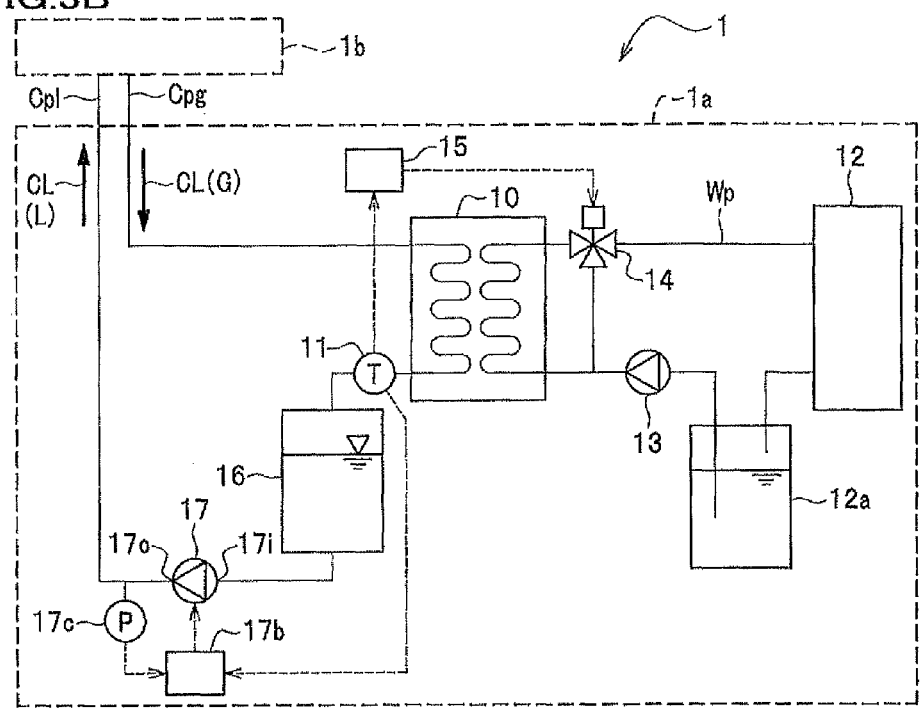
FIG. 3B is a diagram illustrating a configuration including a pressure differential measurement device of an outlet-side pressure gauge and a condenser-refrigerant-liquid temperature sensor.

As illustrated in FIG. 3B, provision of the condenser-refrigerant-liquid temperature sensor 11 at a side of condenser 10 rather than at the suction side 17i of the refrigerant pump 17 enables the temperature of the refrigerant-liquid CL (L) condensed by the condenser 10 to be measured at the suction side 17i. Therefore, it is configured in such a manner that the measurement value of the condenser-refrigerant-liquid temperature sensor 11 is input into the refrigerant-pump controller 17b. The configuration may further include a pressure gauge (outlet-side pressure gauge 17c) which measures the pressure at the discharge-side 17o of the refrigerant pump 17, and may input the measured value into the refrigerant pump controller 17b. According to the configuration, the condenser-refrigerant-liquid temperature sensor 11 and the outlet-side pressure gauge 17c constitute a pressure-difference measurement device.

The refrigerant pump controller 17b calculates the temperature of the refrigerant-liquid CL (L) based on the measurement value which is input from the condenser-refrigerant-liquid temperature sensor 11, and calculate (estimate) the pressure corresponding to the temperature. The temperature and the pressure of the refrigerant-liquid CL (L) have a correlation which is shown, for example, by a Mollier chart. The refrigerant pump controller 17b easily calculates (or estimates) the pressure of the refrigerant-liquid CL (L) at the suction side 17i based on the temperature of the refrigerant-liquid CL (L).

The refrigerant pump controller 17b calculates (estimates) the pressure based on the temperature of the refrigerant-liquid CL (L) to determine the pressure at the suction side 17i. The refrigerant pump controller 17b determines the pressure at the discharge side 17o by adding a predetermined differential-pressure setting value to the calculated (estimated) pressure at the suction side 17i. The refrigerant pump controller 17b regulates the rotation frequency of the refrigerant pump 17 for the difference, between the calculated pressure at the discharge side 17o (the pressure obtained by adding the differential-pressure setting value to the pressure at the suction side 17i) and the measurement value of the outlet-side pressure gauge 17c, to come to "0", therefore keeping the pressure difference ΔPp between the suction side 17i and the discharge side 17o at the predetermined differential-pressure setting value.

According to the cooling system 1 as configured in this manner, if the measurement value of the condenser-refrigerant-liquid temperature sensor 11 is constant, that is, the temperature of the refrigerant-liquid CL (L) is constant, the refrigerant pump controller 17b regulates the rotation frequency of the refrigerant pump 17 for the measurement value of the outlet-side pressure gauge 17c to become constant, which keeps the pressure difference ΔPp between the suction side 17i and the discharge side 17o at a predetermined differential-pressure setting value.

The cooling system 1 may be configured to include a pressure-difference measurement device including: the outlet-side pressure gauge 17c (see FIG. 3B) which measures the pressure at the discharge side 17o of the refrigerant pump 17 (see FIG. 3B); and a pressure gauge (inlet-side pressure gauge (not shown in Figs.) which measures the pressure at the suction side 17i.

In the cooling system 1 as configured in this manner, the refrigerant pump controller 17b calculates the pressure difference ΔPp between the suction side 17i and the discharge side 17o of the refrigerant pump 17 from the measurement-value difference between the outlet-side pressure gauge 17c and the inlet-side pressure gauge.

The refrigerant pump controller 17b regulates the rotation frequency of the refrigerant pump 17 to make the calculated pressure difference ΔPp come to a predetermined differential-pressure setting value.

As described above, the cooling system 1 according to the embodiment (see FIG. 1) keeps the temperature of the refrigerant-liquid CL (L), condensed at the first side 1a, at the predetermined target refrigerant-liquid temperature. The cooling system 1 regulates the flow rate of the refrigerant-liquid CL (L) to be supplied to the evaporators 21a, 21b (the pressure of the refrigerant-liquid CL (L) in the evaporators 21a, 21b) to keep the temperature of the low-temperature air AL, to be cooled by the evaporators 21a, 21b at the second side 1b (see FIG. 1), at a predetermined target cooling temperature. This configuration enables the temperature of the low-temperature air AL (see FIG. 1) at the second side 1b to be kept at a required target cooling temperature without controlling the rotation frequency of the refrigerant pump 17 (see FIG. 1), even when the cooling system 1 comes into a partial load operation.

When the cooling system 1 includes, at the second side 1b (see FIG. 2), a dew-point thermometer 90 (see FIG. 2) which detects the dew-point temperature of the data center 80 (see FIG. 2) having the coolers 20a, 20b (see FIG. 1) arranged therein, the temperature of the refrigerant-liquid CL (L) produced at the first side 1a (see FIG. 2) is made higher than the dew point temperature of the data center 80. This prevents the occurrence of the dew condensation on the coolers 20a, 20b (evaporators 21a, 21b (see FIG. 1)).

The cooling system 1 according to the embodiment (see FIG. 3A) regulates the rotation frequency of the refrigerant pump 17 (see FIG. 3A) to make the pressure difference ΔPp between the suction side 17i and the discharge side 17o of the refrigerant pump 17 (see FIG. 3A) become constant (to make the pressure difference ΔPp come to the predetermined differential-pressure setting value). Therefore, for example, even if failure of the cold source 12 (see FIG. 3A) causes the temperature of the refrigerant fluid CL (L) to be raised, a discharge force by the refrigerant pump 17 is appropriately kept, which allows the high-temperature exhausts AH (see FIG. 1) to be appropriately cooled in the evaporators 21a, 21b.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A cooling system comprising:
at least one evaporator, wherein each evaporator is configured to evaporate a refrigerant and to cool an object to be cooled by heat exchange between the refrigerant and the object to be cooled;
a refrigerant-supply-flow-rate regulator configured to regulate a flow rate of the refrigerant to be supplied to each evaporator;
a post cooling temperature measurement device configured to measure a temperature of the object cooled by each evaporator, through heat exchange with the refrigerant;
a condenser configured to condense a refrigerant, evaporated by the at least one evaporator, by cooling the evaporated refrigerant through heat exchange between the evaporated refrigerant and a chilled water;
a refrigerant-temperature measurement device configured to measure a temperature of the refrigerant condensed by the condenser;
a chilled-water-flow-rate regulator configured to regulate a flow rate of the chilled water to be supplied to the condenser; and
a dew point temperature measurement device configured to measure a dew-point temperature of air in a peripheral environment where the at least one evaporator is arranged;
wherein the refrigerant condensed by the condenser is pressurized so as to be supplied to the at least one evaporator;
wherein the chilled-water-flow-rate regulator is configured to regulate a flow rate of the chilled water to be supplied to the condenser such that a temperature of the condensed refrigerant is equal to a predetermined target refrigerant-liquid temperature;
wherein the refrigerant supply-flow-rate regulator is configured to regulate the flow rate of the refrigerant to be supplied to each evaporator such that a temperature of the object cooled is equal to a predetermined target cooling temperature for each evaporator;
wherein the chilled-water-flow-rate regulator is configured to regulate a flow rate of the chilled water to be supplied to the condenser such that a temperature of the condensed refrigerant is equal to or higher than the dew-point temperature if the target refrigerant-liquid temperature is lower than the dew-point temperature measured by the dew-point temperature measurement device.

2. The cooling system comprising:
at least one evaporator, wherein each evaporator is configured to evaporate a refrigerant and to cool an object to be cooled by heat exchange between the refrigerant and the object to be cooled;
a refrigerant-supply-flow-rate regulator configured to regulate a flow rate of the refrigerant to be supplied to each evaporator;
a post-cooling temperature measurement device configured to measure a temperature of the object cooled by each evaporator, through heat exchange with the refrigerant;
a condenser configured to condense a refrigerant evaporated by the at least one evaporator by cooling the evaporated refrigerant through heat exchange between the evaporated refrigerant and a chilled water;
a refrigerant-temperature measurement device configured to measure a temperature of the refrigerant condensed by the condenser; and
a chilled-water-flow-rate regulator configured to regulate a flow rate of the chilled water to be supplied to the condenser;
a refrigerant pump configured to pressure the refrigerant condensed by the condenser to be supplied to the at least one evaporator;
a pressure-difference measurement device configured to measure a pressure difference of the condensed refrigerant between a suction side and a discharge side of the refrigerant pump;
a refrigerant pump controller configured to regulate a rotation frequency of the refrigerant pump such that the pressure difference calculated based on a measurement value of the pressure difference measurement device is equal to a predetermined differential-pressure setting value;
wherein the refrigerant condensed by the condenser is pressurized so as to be supplied to the at least one evaporator;
wherein the chilled-water-flow-rate regulator is configured to regulate a flow rate of the chilled water to be supplied to the condenser such that a temperature of the condensed refrigerant is equal to a predetermined-liquid temperature; and
wherein the refrigerant-supply-flow-rate regulator is configured to regulate the flow rate of the refrigerant to be supplied to each evaporator such that a temperature of the object cooled is equal to a predetermined target cooling temperature for each evaporator.

3. The cooling system according to claim 2,
wherein the pressure difference measurement device includes:
an outlet-side pressure gauge configured to measure a pressure of the condensed refrigerant at a discharge side of the refrigerant pump, and
a refrigerant-temperature measurement device provided at a suction side of the refrigerant pump;
wherein the refrigerant-pump controller is configured to calculate a pressure of the condensed refrigerant at the suction side of the refrigerant pump based on a measurement value by the refrigerant-temperature and to calculate a pressure of the condensed refrigerant at the discharge side of the refrigerant pump based on a measurement value by the outlet-side pressure gauge; and
wherein the refrigerant-pump controller is configured to determine, as said pressure difference, a pressure difference between the condensed refrigerant at the suction side of the refrigerant pump and the condensed refrigerant at the discharge side of the refrigerant pump.

4. The cooling system according to claim 2,
wherein the cooling system includes: the condenser at a first side, and the at least one evaporator at a second side; and
wherein the first side serving as a refrigerant natural-circulation type is configured such that: the first side is disposed to be higher than the second side, the refrigerant condensed at the first side is sent to the second side through a refrigerant pipe, and the refrigerant condensed by the condenser drops into the refrigerant pipe, to be pressurized in order to be supplied to the at least one evaporator.

5. The cooling system according to claim 2, further comprising:
a dew-point-temperature measurement device configured to measure a dew-point temperature of air in a peripheral environment where the at least one evaporator is arranged,
wherein the chilled-water-flow-rate regulator is configured to regulate a flow rate of the chilled water to be supplied to the condenser such that a temperature of the condensed refrigerant is equal to or higher than the dew-point temperature if the target refrigerant-liquid temperature is lower than the dew-point temperature measured by the dew-point temperature measurement device.

6. A method for controlling a cooling system, comprising:
providing at least one evaporator;
evaporating, by each evaporator, a refrigerant to cool an object to be cooled by heat exchange between the refrigerant and the object;
regulating, by use of a refrigerant-supply-flow-rate regulator, a flow rate of the refrigerant to be supplied to each evaporator;
measuring, by use of a post-cooling-temperature measurement device, a temperature of the object cooled by each evaporator, through heat exchange with the refrigerant;
condensing, by a condenser, a refrigerant evaporated by the at least one evaporator, by cooling the evaporated refrigerant through heat exchange between the evaporated refrigerant and a chilled water;
measuring, by a refrigerant temperature measurement device, a temperature of the refrigerant condensed by the condenser;
regulating, by a chilled-water-flow-rate regulator, a flow rate of the chilled water to be supplied to the condenser;
pressurizing, by a refrigerant pump, the refrigerant condensed by the condenser to be supplied to the at least one evaporator;
regulating, by the chilled-water-flow-rate regulator, a flow rate of the chilled water to be supplied to the condenser such that a temperature of the condensed refrigerant is equal to a predetermined target refrigerant-liquid temperature;
regulating, by the refrigerant-supply-flow-rate regulator, a flow rate of the refrigerant for each evaporator such that a temperature of the object cooled is equal to a predetermined target cooling temperature for each evaporator;
measuring, by a pressure-different measurement device, a pressure different of the condensed refrigerant between a suction side and a discharge side of the refrigerant pump; and
regulating, by a refrigerant pump controller, a rotation frequency of the refrigerant pump such that the pressure difference calculated based on a measurement value of the pressure difference measurement device is equal to a predetermined differential-pressure setting value.

* * * * *